United States Patent [19]

Maloberti et al.

[11] Patent Number: 4,777,392
[45] Date of Patent: Oct. 11, 1988

[54] VOLTAGE REPEATER CIRCUIT FOR LOADS WITH A RESISTIVE COMPONENT WITH HARMONIC DISTORTION COMPENSATION

[75] Inventors: Franco Maloberti, D'Isola; Guido Torelli, S. Alessio, both of Italy

[73] Assignee: SGS-Thomson Microelectronics SpA, Milan, Italy

[21] Appl. No.: 79,155

[22] Filed: Jul. 29, 1987

[30] Foreign Application Priority Data

Jul. 29, 1986 [IT] Italy ............................. 21285 A/86

[51] Int. Cl.$^4$ ..................... H03F 3/18; H03K 17/687
[52] U.S. Cl. .................................. 307/501; 307/576; 307/262
[58] Field of Search ............... 307/496, 500, 501, 576, 307/579, 262, 264

[56] References Cited

U.S. PATENT DOCUMENTS

4,453,054  6/1984  Poil et al. ........................... 307/501
4,714,845  12/1987  Devecchi et al. .................... 307/496

Primary Examiner—Stanley D. Miller
Assistant Examiner—B. P. Davis
Attorney, Agent, or Firm—Wenderoth, Lind & Ponack

[57] ABSTRACT

A voltage repeater circuit for loads with a resistive component with harmonic distortion compensation includes first, second and third MOSFET transistors, respectively N-channel, P-channel, and N-channel. The drain electrode of the first transistor whose gate electrode forms an input terminal of the repeater circuit is connected to the positive terminal of a voltage source via a constant current generator and is coupled to the gate electrode of the second transistor by a first circuit designed to establish a constant voltage between these electrodes, and to the gate electrode of the third transistor, by a second circuit designed to generate a constant voltage between these electrodes. The source electrode of the first transistor is connected to the drain electrode of the second transistor and to the drain electrode of the third transistor at a circuit node which forms an output terminal of the repeater circuit. The source electrodes of the second and third transistors are respectively connected to the positive terminal and the negative terminal of the voltage source.

24 Claims, 4 Drawing Sheets

VOLTAGE REPEATER CIRCUIT FOR LOADS WITH A RESISTIVE COMPONENT WITH HARMONIC DISTORTION COMPENSATION

BACKGROUND OF THE INVENTION

The present invention relates to voltage repeater circuits, and in particular to a voltage repeater circuit with extremely low harmonic distortion for loads with a resistive component of a value which is not very high, particularly suitable for incorporation in a monolithically integrated circuit constructed using MOS (Metal Oxide Semiconductor) technology.

It is often necessary in an integrated circuit to apply a voltage supplied by a high output impedance signal voltage generator to a load with a resistive component whose value is not very high (for example, a few kΩ). In some applications, moreover, in order to drive the resistive component of the load correctly, it is necessary to be able to supply the latter with a current which may have a high swing when a signal voltage is applied to the load.

In order to satisfy this requirement, a voltage repeater circuit is generally interposed between the signal voltage generator and the load; the circuit reproduces the input signal voltage as its output and has a high input impedance and a low output impedance, thereby achieving the required impedance decoupling between the voltage generator and the load.

Voltage repeater circuits are used, for example, in complex circuit structures in monolithically integrated circuits.

The essential requirements of a voltage repeater circuit of this type are:
substantially unity voltage gain;
a low output impedance;
the ability to supply all of the direct and signal currents required to drive the resistive component of the load correctly;
maximum reduction of the harmonic distortion introduced into the output signal, even in the presence of output signals with a high current swing.

Other very important requirements, particularly for some applications, are as follows:
low integration area occupation;
ease of insertion within more complex circuit structures;
limited power dissipation with a high speed of response.

A known voltage repeater circuit, generally known as a unity gain non-inverting "buffer" comprises an operational amplifier which has its output terminal directly connected to its inverting input terminal. The non-inverting input terminal and the output terminal of this amplifier respectively form the input terminal and the output terminal of the repeater circuit. If the open loop voltage gain of the operational amplifier is sufficiently high, the repeater circuit may have a voltage gain fairly close to unity.

In order to drive loads with a resistive component whose value is not very high, it is necessary to use, however, a relatively complex operational amplifier, generally comprising two voltage gain stages in cascade, with a compensation capacitor, and a suitably designed "power" output stage (see, for example, "MOS Operational Amplifier Design—A Tutorial Overview" by P. R. Gray and R. G. Meyer, in IEEE Journal of Solid-State Circuits, Vol. SC-17, No. 6, December 1982, pp. 969–982, Para. VII, and "Large Swing CMOS Power Amplifier" by K. E. Brehmer and J. B. Wieser in IEEE Journal of Solid-State Circuits, Vol. SC-18, No. 6, December 1983, pp. 624–629). The integration area occupation and the power dissipation of this circuit may be excessive. A repeater circuit of this type is not suitable for insertion within more complex, monolithically integrated circuits.

A further known voltage repeater circuit is the so-called source follower, which comprises as its active component a MOSFET transistor which operates in the saturation range. The gate electrode and the source electrode of the transistor respectively form the input terminal and the output terminal of the repeater circuit. If the transconductance $g_m$ of the transistor is sufficiently high, in particular, if its value is much greater than the reciprocal of the value of the output resistance of the transistor and the reciprocal of the resistive component of the load, this circuit has a voltage gain which is fairly close to unity. The output impedance of the circuit which, at signal frequencies lower than the cut-off frequency of the circuit, is roughly equal to the reciprocal of the transconductance $g_m$ of the transistor, may not, however, be sufficiently low to ensure a voltage gain of the repeater circuit which is substantially unitary when the value of the resistive component of the load is a few kΩ or less. In addition, in the event of a strong swing in the input voltage, and therefore in the output voltage, there is considerable variation in the current passing through the transistor and the load, particularly if the value of the resistive component of the load is low. Since the transconductance value of a MOSFET transistor operating in the saturation range is, as is known to those skilled in the art, proportional to the square root of the current passing through the transistor, it follows that this repeater circuit has a voltage gain which varies with variations in the voltage supplied as output, which leads naturally to the introduction of harmonic distortion into the output signal.

Figure 1:
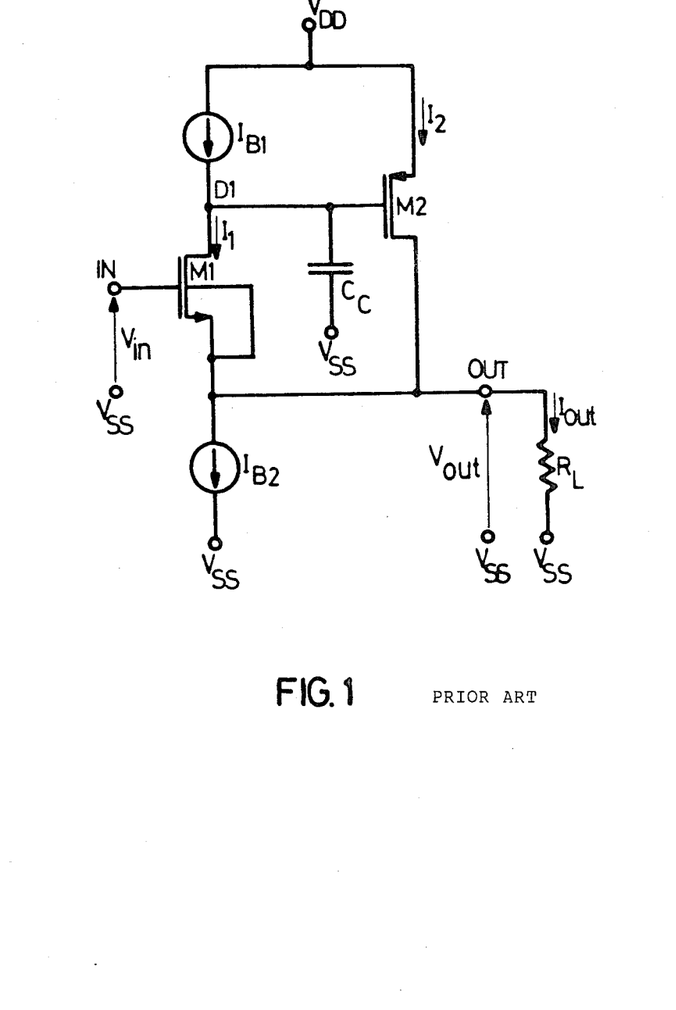
FIG. 1 is a circuit diagram of the known voltage repeater circuit comprising two MOSFET transistors described above.

In order to obtain a voltage repeater circuit with an output impedance whose value is lower than that which may be obtained with the conventional source follower circuit described above, and therefore to btain a circuit with a voltage gain which is even closer to unity, use may be made of a more complex known circuit structure, shown in FIG. 1.

The circuit comprises a first N-channel MOSFET transistor M1 and a second P-channel MOSFET transistor M2. The gate electrode of the transistor M1 forms an input terminal IN of the voltage repeater circuit.

The drain electrode of the transistor M1 and the gate electrode of the transistor M2 are connected together at a first circuit node D1 which is connected to the positive terminal $V_{DD}$ of a voltage source via a first constant current generator $I_{B1}$.

The source electrode of the transistor M1 and the drain electrode of the transistor M2 are connected together at a second circuit node which is connected to the negative terminal $V_{SS}$ of the voltage source via a second constant current generator $I_{B2}$. This circuit node forms an output terminal OUT of the voltage repeater circuit.

The source electrode of the transistor M2 is connected to the positive terminal $V_{DD}$.

The substrate electrode of the transistor M1 is directly connected to the source electrode of the transistor.

A load $R_L$, of a purely resistive type for the purposes of illustration, is inserted between the output terminal OUT and the negative terminal $V_{SS}$.

The two constant current generators $I_{B1}$ and $I_{B2}$ are constructed using techniques known to those skilled in the art: the values of the currents which they supply are correlated and are such as to suitably bias the two transistors M1 and M2 which operate in the saturation range.

FIG. 1 also shows a capacitor $C_C$ connected between the circuit node D1 and the negatlve terminal $V_{SS}$ which may possibly be necessary for frequency compensation. This capacitor has a fairly small value of a very few pF. In the description of the operation of the circuit which follows and which relates to signal frequencies lower than the cut-off frequency of the circuit, the effects of this capacitor will be disregarded.

When a voltage to be repeated $V_{in}$ is supplied between the input terminal IN and the negative terminal $V_{SS}$, an output voltage $V_{out}$ is supplied by the repeater circuit between the output terminal OUT and the negative terminal $V_{SS}$.

The two transistors M1 and M2 and the load resistance $R_L$ are traversed by currents which are indicated in FIG. 1 by $I_1$, $I_2$ and $I_{out}$ respectively.

Figure 2A:
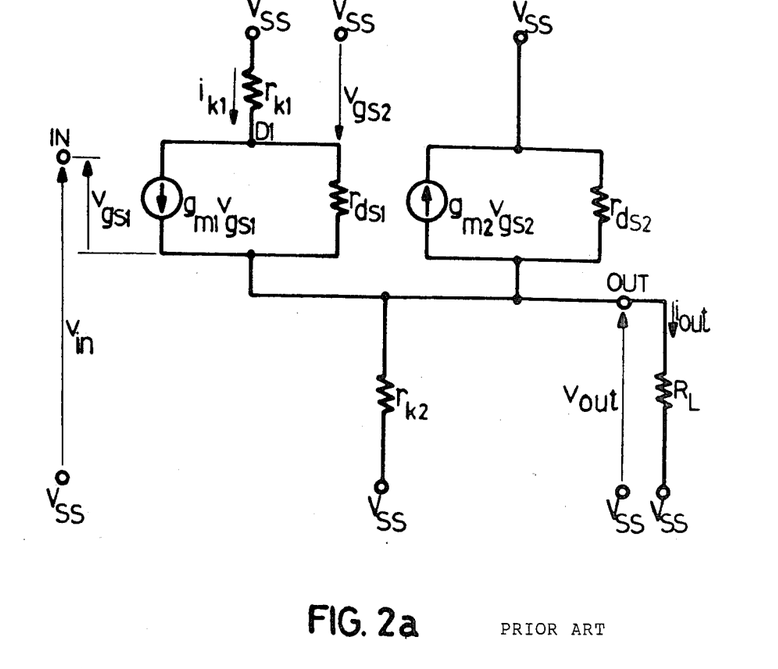
FIG. 2a is a diagram of an equivalent circuit for a small signal of the known voltage repeater circuit shown in FIG. 1.

FIG. 2a shows the equivalent circuit for a small signal of the circuit of FIG. 1. This circuit is obtained by substituting its equivalent circuit for each of the components of the circuit structure of FIG. 1. Each of the two MOSFET transistors is replaced by a circuit formed by the parallel combination of the output resistance of the transistor and a voltage controlled current generator which supplies, in the drain-source direction with an input direction into the source electrode, a current whose value is equal to the product of the transconductance of the transistor and the signal voltage present between the gate electrode and the source electrode of the transistor. Each of the two constant current generators, considered to be real, is replaced by its own equivalent output resistance. In FIG. 2a account has, in contrast, been taken of the fact that, from the point of view of the signal, the two terminals of the voltage source are to be considered to be short circuited together. In accordance with the above, in this equivalent circuit, the trimmer capacitor $C_C$ has been disregarded. The load resistance $R_L$ is inserted between the output terminal OUT and the negative terminal $V_{SS}$.

In FIG. 2a, $v_{gs1}$, $g_{m1}$ and $r_{ds1}$ respectively indicate the signal voltage between the gate electrode and the source electrode, the transconductance and the output resistance of the transistor M1; $v_{gs2}$, $g_{m2}$ and $r_{ds2}$ respectively indicate the signal voltage between the gate electrode and the source electrode, the transconductance and the output resistance of the transistor M2 and $r_{k1}$ and $r_{k2}$ respectively indicate the output resistance of the constant current generator $I_{b1}$ and that of the generator $I_{B2}$; $v_{in}$ and $v_{out}$ respectively indicate the input signal voltage and the output signal voltage; $i_{out}$ indicates the output signal current which passes through the load resistance $R_L$: this obviously produces $i_{out}=v_{out}/R_L$.

Figure 2B:
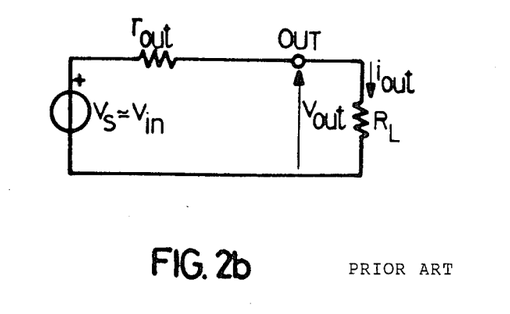

Applying Thevenin's theorem, the equivalent circuit of FIG. 2a is converted into the circuit shown in FIG. 2b, in which the equivalent circuit of the voltage repeater circuit is replaced by a real signal voltage generator $v_s$ having an output resistance $r_{out}$.

Given that the value of the transconductance $g_{m1}$ is generally much greater than the reciprocal of the value of the resistances $r_{ds1}$, $r_{ds2}$ and $r_{k2}$, simple calculations provide $v_s \simeq v_{in}$.

The calculation of the output resistance of the circuit $r_{out}$ may be carried out, with reference to FIG. 2a, by supplying a voltage $v_x$ between the output terminal OUT and the negative terminal $V_{SS}$ and calculating the current $i_x$ which enters the voltage repeater circuit via the output terminal, assuming that the input terminal IN is connected to a fixed potential ($v_{in}=0$). This produces, by definition:

$$r_{out} \equiv v_x/i_x \qquad (1)$$

Obviously, $v_{gs1} = -v_x$, given that the gate electrode of the transistor M1 is assumed to be connected to a fixed potential.

It is now necessary to calculate the signal voltage $v_{gs2}$. If the signal current passing through the resistance $r_{k1}$ is called $i_{k1}$, this produces:

$$i_{k1} = \frac{v_{gs2} - v_x}{r_{ds1}} + g_{m1}v_{gs1} = \frac{v_{gs2} - v_x}{r_{ds1}} - g_{m1}v_x \qquad (2)$$

$$v_{gs2} = -i_{k1}r_{k1} = -\frac{r_{k1}}{r_{ds1}}(v_{gs2} - v_x) + g_{m1}v_x r_{k1} \qquad (3)$$

$$v_{gs2}\left(1 + \frac{r_{k1}}{r_{ds1}}\right) = v_x \frac{r_{k1}}{r_{ds1}} + g_{m1}v_x r_{k1} \qquad (4)$$

$$\frac{v_{gs2}}{r^*_{d1}} = v_x\left(\frac{1}{r_{ds1}} + g_{m1}\right) \qquad (5)$$

in which $r^*_{d1} \equiv r_{ds1}r_{k1}/(r_{ds1}+r_{k1})$ is the resistance equivalent to the parallel between $r_{ds1}$ and $r_{k1}$. If $g_{m1} > 1/r_{ds1}$, this produces:

$$v_{gs2} \simeq v_x g_{m1} r^*_{d1} \qquad (6)$$

Thus, disregarding the currents passing through $r_{ds1}$ and $r_{ds2}$ with respect to the currents $g_{m1}v_{gs1}$ and $g_{m2}v_{gs2}$, and also disregarding the current passing through the resistance $r_{k2}$, the following is produced:

$$i_x \simeq -g_{m1}v_{gs1} + g_{m2}v_{gs2} \simeq g_{m1}v_x + g_{m2}g_{m1}r^*_{d1}v_x = g_{m1}(1+g_{m2}r^*_{d1})v_x \qquad (7)$$

which finally provides:

$$r_{out} \simeq \frac{1}{g_{m1}\left(1 + g_{m2}r^*_{d1}\right)} \qquad (8)$$

With respect to the simple source follower circuit described above, the circuit of FIG. 1 therefore has an output resistance which is lower by a factor $(1+g_{m2}r^*_{d1})$, which, with a normal dimensioning of the circuit ($g_{m2} > \frac{1}{2}*_{d1}$) is approximately equal to $g_{m2}r^*_{d1}$. The voltage gain of the circuit, which is substantially equal to $R_L/(R_L+r_{out})$ is consequently fairly close to unity even in the presence of load resistances of relatively low value.

The value of the harmonic distortion introduced into the output signal, however, although reduced with respect to the case of the simple source follower circuit, is still not at an optimum value. The value of the current $I_1$ which passes through the transistor M1 is equal to that of the current supplied by the constant current generator $I_{B1}$, as a result of which the value of the transconductance $g_{m1}$ remains constant and does not depend on the voltage value $V_{out}$ supplied as output. The value of $r^*_{d1}$ does not depend either on the value of the voltage supplied as output, given that neither $r_{k1}$ nor $r_{ds1}$ depend thereon. In the presence of wide voltage swings in the output signal, however, the value of the current $I_{out}$ which passes through the load resistance $R_L$ varies greatly as a function of the voltage itself. Given that the entire signal current $i_{out}$ which passes through the output resistance passes through the transistor M2 (which in fact gives $I_2 = I_{out} + I_{B2} - I_1$), if the value of the load resistance $R_L$ is not very high, the value of the current $I_2$ which passes through the transistor M2 varies substantially with variations in the voltage $V_{out}$ as a result of which the value of the transconductance $g_{m2}$ and therefore the value of $r_{out}$ vary as a function of the latter. The voltage gain of the circuit structure of FIG. 1 therefore varies with variations in the value of the voltage supplied as output and harmonic distortion is consequently introduced into the output signal.

In order to reduce the harmonic distortion in the output signal, it would be possible to bias the circuit in such a way that the rest value of the current $I_2$ is much higher than the maximum output signal current $i_{out}$ in order to make the variations to which the transconductance $g_{m2}$ is subject when the voltage supplied as output by the circuit varies, negligible. This would lead, however, in the presence of loads with a resistive component of relatively low value, to an excessive power dissipation by the circuit and would not, therefore, be an ideal solution.

SUMMARY OF THE INVENTION

The object of the present invention is to construct a voltage repeater circuit designed to drive a load with a resistive component with a fairly low value, which, at the same cost and with an equivalent performance to known repeater circuits, introduces only a very low harmonic distortion into the output signal.

This object may be achieved by providing a voltage repeater circuit with low harmonic distortion for loads with a resistive component, having at least one input terminal for connection to a voltage generator and at least one output terminal for connection to a load, comprising: a first MOSFET transistor having a first type of conductivity, a second MOSFET transistor having a second type of conductivity which is opposite to said first type of conductivity, and a third MOSFET transistor having said first type of conductivity, a gate electrode of said first transistor forming the input terminal of the repeater circuit; a source electrode of said first transistor and drain electrodes of said second and third transistors being connected together at circuit node which forms the output terminal of the repeater circuit; a drain electrode of said first transistor being connected to a first terminal of a voltage source by means of a constant current generator and being further coupled to a gate electrode of said second transistor by a first circuit means for generating a constant potential difference between these two electrodes, and to a gate electrode of said third transistor by a second circuit means for generating a constant potential difference between these two electrodes; a source electrode of said second transistor being connected to said first terminal of said voltage source and a source electrode of third transistor being connected to a second terminal of said voltage source.

BRIEF DESCRIPTION OF THE DRAWINGS

The invention is set out in detail in the following description, given purely by way of non-limiting example, with reference to the following drawings, in which:

FIG. 2b is a diagram of a simplified equivalent circuit derived from the circuit of FIG. 2a;

FIG. 4b is a diagram of an equivalent circuit derived from the circuit of FIG. 4a;

DESCRIPTION OF THE PREFERRED EMBODIMENTS

Figure 3:
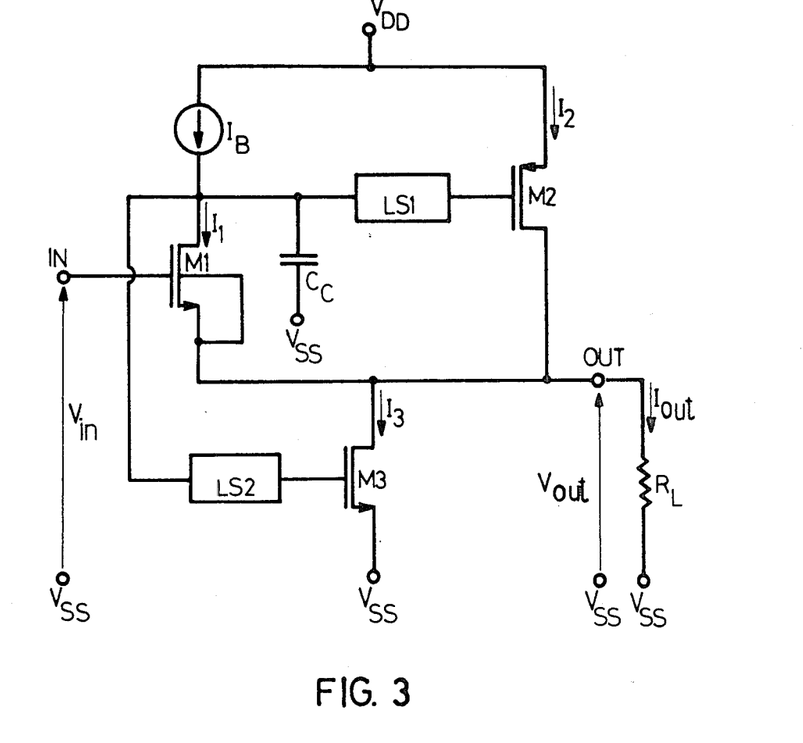
FIG. 3 is a circuit diagram, partly in block form, of a voltage repeater circuit with harmonic distortion compensation, for loads with a resistive component whose value is not very high, in accordance with the present invention.

A voltage repeater circuit of the invention shown in FIG. 3 comprises first, second and third MOSFET transistors M1, M2 and M3, respectively N-channel, P-channel and N-channel.

The gate electrode of the transistor M1 forms an input terminal IN of the voltage repeater circuit.

The source electrode of the transistor M1 and the drain electrodes of the transistors M2 and M3 are connected together at a circuit node which forms an output terminal OUT of the voltage repeater circuit.

The drain electrode of the transistor M1 is connected to the positive terminal $V_{DD}$ of a voltage source via a constant current generator $I_B$, constructed in a manner known to persons skilled in the art, and is also connected to the gate electrode of the transistor M2 via a first circuit means, shown in FIG. 3 by the block LS1, designed to generate a constant potential difference between these two electrodes of a value such as to enable a correct operating condition of the transistor M2 even in the presence of an input signal voltage having a high swing. This circuit means may be formed, for example, by a so-called "level shifter" constructed in a manner known to those skilled in the art. Examples include batteries, diodes, Zener diodes, etc.

The substrate electrode of the transistor M1 is directly connected to the source electrode of the transistor.

The source electrodes of the transistors M2 and M3 are respectively connected to the positive terminal $V_{DD}$ and the negative terminal $V_{SS}$ of the voltage source.

The drain electrode of the transistor M1 is also connected to the gate electrode of the transistor M3 via a second circuit means, constructed in a known manner and shown in FIG. 3 by the block LS2, designed to generate a constant potential difference between these two electrodes of a value such as to enable a correct biasing of the transistor M3.

The circuit of FIG. 3 also comprises a capacitor $C_C$ connected between the drain electrode of the transistor M1 and the negative terminal $V_{SS}$ which may be needed for frequency compensation. This capacitor has a relatively small value of a very few pF. As in the case of the circuit of FIG. 1, in the following description of the operation of the circuit with reference to signal frequencies lower than the cut-off frequency of the circuit, the effects of this capacitor will be disregarded.

All three transistors M1, M2 and M3 of the circuit operate in the saturation range.

A load $R_L$, purely of a resistive type for the purposes of illustration, is inserted between the output terminal OUT of the voltage repeater circuit and the negative terminal $V_{SS}$.

When a voltage to be repeated $V_{in}$ is supplied between the input terminal IN and the negative terminal $V_{SS}$, an output voltage $V_{out}$ is then supplied by the repeater circuit between the output terminal OUT and the negative terminal $V_{SS}$.

The three transistors M1, M2 and M3 and the load resistance $R_L$ are traversed by currents shown respectively in FIG. 3 by $I_1$, $I_2$, $I_3$ and $I_{out}$.

Figure 4A:
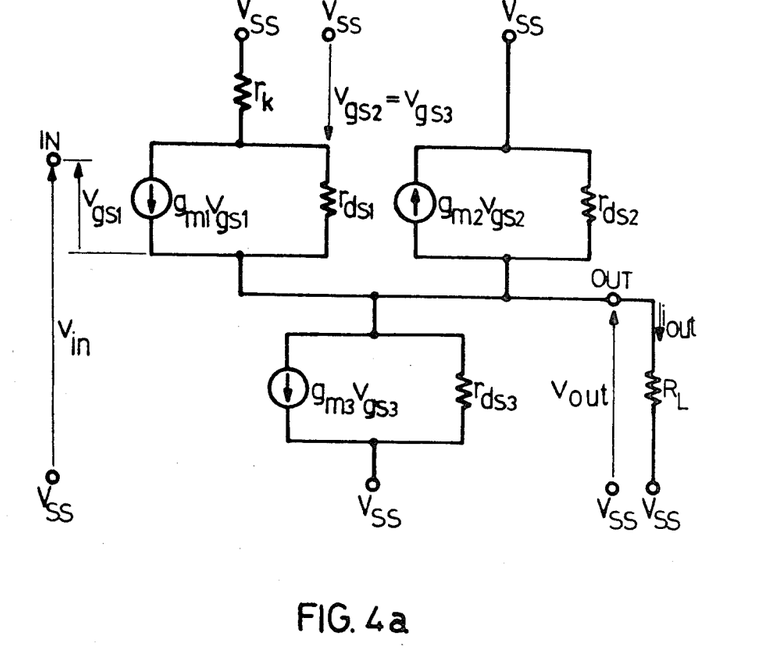
FIG. 4a is a diagram of an equivalent circuit for a small signal of the voltage repeater circuit of the invention shown in FIG. 3.

FIG. 4a shows an equivalent circuit for a small signal of the circuit of FIG. 3. As in the case of the equivalent circuit of FIG. 2a, this circuit is obtained by substituting its equivalent circuit for each of the components of the circuit structure of FIG. 3. The compensation capacitor $C_C$ has been disregarded. In obtaining the equivalent circuit, account has been taken of the fact that, from the point of view of the signal, the two terminals of the voltage source are to be considered to be short circuited together, and also that each of two circuit means LS1 and LS2 is seen as a short-circuit. The load resistance $R_L$, through which there passes a signal current shown in FIG. 4a by $i_{out}$, is obviously inserted between the output terminal OUT and the negative terminal $V_{SS}$.

In FIG. 4a, $v_{gsi}$, $g_{mi}$ and $r_{dsi}$ respectively indicate the signal voltage present between the gate electrode and the source electrode, the transconductance and the output resistance of the transistor Mi, for i=1, 2, 3, and $r_k$ indicates the output resistance of the constant current generator $I_B$ considered to be real; $v_{in}$ and $v_{out}$ respectively indicate the input signal voltage and the output signal voltage.

Figure 4B:
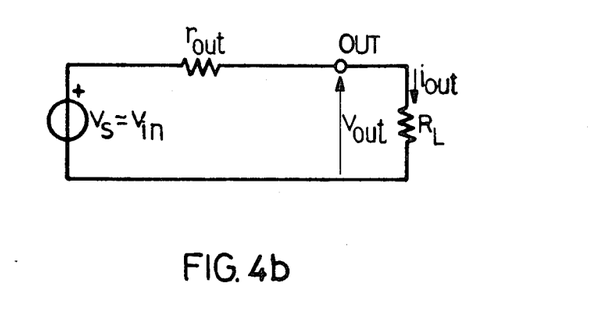

In the same way as for the equivalent circuit of FIG. 2a, by applying Thévenin's theorem, the equivalent circuit of FIG. 4a may also be converted into a simpler equivalent circuit, shown in FIG. 4b, in which the equivalent circuit of the voltage repeater circuit has been replaced by a real signal voltage generator having a value $v_s$, with an output resistance $r_{out}$. Given that with a normal dimensioning of the circuit the value of the transconductance $g_{m1}$ is much greater than the reciprocal of the value of the resistances $r_{ds1}$, $r_{ds2}$ and $r_{ds3}$, simple calculations provide $v_s \simeq v_{in}$.

The value of $r_{out}$ may be calculated, as normal, by supplying a voltage $v_x$ between the output terminal OUT and the negative terminal $V_{SS}$, calculating the current $i_x$ which enters the equivalent circuit of the voltage repeater circuit via the output terminal OUT, assuming that the input terminal IN is connected to a fixed potential ($v_{in}=0$) and thus carrying out the relationship shown in expression (1).

Proceeding in the same way as in the case of the analysis of the circuit of FIG. 2a, bearing in mind, in addition, that $v_{gs1} = -v_x$ and $v_{gs2} = v_{gs3}$ and disregarding the currents which pass through the resistances $r_{ds1}$, $r_{ds2}$ and $r_{ds3}$ with respect to the currents $g_{m1}v_{gs1}$, $g_{m2}v_{gs2}$ and $g_{m3}v_{gs3}$, this provides:

$$i_x \simeq -g_{m1}v_{gs1} + g_{m2}v_{gs2} + g_{m3}v_{gs3} = g_{m1}v_x + (g_{m2}+g_{m3})v_{gs2} =$$
$$\simeq g_{m1}v_x + (g_{m2}+g_{m3})g_{m1}r^*_d v_x = g_{m1}[1+(g_{m2}+g_{m3})r^*_d]v_x \quad (9)$$

in which $r^*_d \equiv r_{ds1}r_k/(r_{ds1}+r_k)$ is the resistance equivalent to the resistances $r_{ds1}$ and $r_k$ connected together in parallel.

This provides:

$$r_{out} \simeq \frac{1}{g_{m1}[1+(g_{m2}+g_{m3})r^*_d]} \quad (10)$$

which, using the conventional hypothesis $(g_{m2}+g_{m3})r^*_d \gg 1$, gives:

$$r_{out} \simeq \frac{1}{g_{m1}(g_{m2}+g_{m3})r^*_d}$$

The voltage repeater circuit of FIG. 3 therefore has an output resistance which is lower than that of the known repeater circuit of FIG. 1.

The basic advantage of this circuit, however, does not lie so much in this reduction of the value of the output resistance which, with a normal dimensioning of the circuit ($G_{m2}$ and $g_{m2}$ with the same order of magnitude), is approximately half the value of the output resistance of the known circuit of FIG. 1, but rather in the reduction of the harmonic distortion introduced from the circuit itself into the output signal.

In the presence, for example, of a positive variation in the input voltage $V_{in}$ and therefore in the output voltage $V_{out}$, there is a negative variation in the voltage between the drain electrode of the transistor M1 and the negative terminal $V_{SS}$, an increase in the current $I_2$ which passes through the transistor M2 and a decrease in the current $I_3$ which passes through the transistor M3. Consequently, the values of the transconductances $g_{m2}$ and $g_{m3}$ undergo an opposite variation: while the value of $g_{m2}$ increases, the value of $g_{m3}$ decreases. The opposite obviously takes place in the presence of a negative variation in the input voltage $V_{in}$. By suitably dimensioning the circuit it is possible to obtain a good compensation between the variations in the value of the two transconductances $g_{m2}$ and $g_{m3}$, which substantially cancels out the variation of the output resistance $r_{out}$ of the overall circuit structure, and therefor also of the harmonic distortion introduced into the output signal from the circuit. It should be borne in mind that, as in the case of the circuit structure of FIG. 1, the value of the current $I_1$ which passes through the transistor M1, and therefore also that of the transconductance $g_{m1}$, as well as the value of the resistance $r^*_d$ equivalent to the resistances $r_{ds1}$ and $r_k$ connected together in parallel, do not substantially depend on the value of the voltage $V_{out}$ supplied as output.

This compensation effect between the variations of the two transconductances $g_{m2}$ and $g_{m3}$ will now be examined in detail. The relationship which expresses the transconductance $g_m$ of a transistor may, as is known, be written as follows:

$$g_m = 2k' \frac{W}{L} |(V_{gs} - V_{th})| \qquad (11)$$

in which k' is the conduction factor of the transistor, W and L are its width and length (distance between source and drain) respectivel $V_{gs}$ is the voltage between its gate electrode and its source electrode and $V_{th}$ is its threshold voltage. In expression (11) account has been taken of the fact that, in accordance with the conventions used in the equivalent circuits of FIG. 2a and FIG. 4a, the transconductance of a MOSFET transistor always has a positive value, both for N-channel and P-channel transistors.

This then produces:

$$g_{m2} = 2k'_2 \left(\frac{W}{L}\right)_2 (-V_{g2} + V_{DD} + V_{thp})$$

$$g_{m3} = 2k'_3 \left(\frac{W}{L}\right)_3 (V_{g3} - V_{SS} - V_{thn})$$

where the figure (2 or 3) attached as a subscript to the symbol of a magnitude indicates the transistor (M2 or M3) to which the magnitude relates. $V_{thp}$ and $V_{thn}$ are the threshold voltages of the transistors M2 and M3 respectively. $V_{g2}$ and $V_{g3}$ respectively indicate the potential of the gate electrode of the transistor M2 and the potential of the gate electrode of the transistor M3 with respect to a fixed potential (for example that of the negative terminal $V_{SS}$).

A variation of the input voltage $V_{in}$ causes variations of the two transconductances equal to:

$$\delta g_{m2} = 2k'_2 \left(\frac{W}{L}\right)_2 (-\delta V_{g2})$$

$$\delta g_{m3} = 2k'_3 \left(\frac{W}{L}\right)_3 (\delta V_{g3})$$

in which $\delta V_{g2}$ and $\delta V_{g3}$ respectively indicate the variation of the potential $V_{g2}$ and of the potential $V_{g3}$ following the variation of the input voltage $V_{in}$, and in which it is supposed that the values of the threshold voltages $V_{thp}$ and $V_{thn}$ remain substantially unchanged with variations in the voltages $V_{in}$ and $V_{out}$.

Given that, from the point of the view of the signal, each of the circuit blocks LS1 and LS2 is seen as a short circuit, $\delta V_{g2} \delta V_{g3}$. The variation of the sum of the two transconductances is then:

$$\delta(g_{m2} + g_{m3}) \equiv \qquad (12)$$

$$\delta g_{m2} + \delta g_{m3} = 2\left[k'_3\left(\frac{W}{L}\right)_3 - k'_2\left(\frac{W}{L}\right)_2\right]\delta V_{g3}$$

By dimensioning the circuit of FIG. 3, in particular the two transistors M2 and M3 in such a way that:

$$k'_3\left(\frac{W}{L}\right)_3 = k'_2\left(\frac{W}{L}\right)_2 \qquad (13)$$

there is an exact compensation between the variations in the value of the two transconductances $g_{m2}$ and $g_{m3}$, as a result of which the value of the output resistance of the voltage repeater circuit $r_{out}$, given by expression (10), remains constant with variations in the value of the voltage $V_{out}$ supplied as output. No harmonic distortion is therefore introduced into the output signal of the circuit. The dimensioning of the circuit to satisfy expression (13) is simple, and may be carried out using techniques known to those skilled in the art.

It should be stressed that, in a circuit of the invention, the compensation between the variations of the value of the transconductances of the two transistors M2 and M3 is optimal even in the presence of wide swings in the input and the output voltages.

Undesirable effects may be due, for example, to the variation of the threshold voltage of the transistors M2 and/or M3 if operating conditions vary or to imperfect matching, from the point of view of transconductance, between the transistors M2 and M3. These effects are, however, of secondary importance as a result of which the harmonic distortion introduced by the voltage repeater circuit of the invention is in practice minimal.

The circuit of FIG. 3 also satisfies requirements 5, 6 and 7 mentioned in the preamble fairly well, since it requires a smallish integration area for construction, can be readily inserted within complex circuit structures and does not require a high total supply current.

In the case in which the load also has a capacitive component, the analysis given above is still fully valid, although for signal frequencies lower than the cut-off frequency of the circuit.

The voltage between the positive terminal $V_{DD}$ and the gate electrode of the transistor M2, $V_{DD} - V_{g2}$ is equal to:

$$V_{DD} - V_{g2} = |V_{thp}| + V_{OV2} \qquad (14)$$

in which $V_{OV2}$ is, as is known, the so-called gate-source overdrive voltage required for the current $I_2$ to pass through the transistor M2, and is expressed as $V_{OV2} = \sqrt{I_2/k'_2(W/L)_2}$. Given that the current $I_2$ and the overdrive voltage $V_{OV2}$ may reach comparatively high values, particularly in the presence of a load resistance $R_L$ of low value, it is appropriate in many cases, particularly in the presence of an input voltage $V_{in}$ having high values, for the drain electrode of the transistor M1 to have, during operation, a positive potential with respect to the gate electrode of the transistor M2, in order to ensure that the transistor M1 always operates in a saturation range, as is required for the correct operation of the repeater circuit. This is achieved, in the circuit of FIG. 3, by the circuit block LS1, which enables the repeater circuit to operate correctly even in the presence of values of the input voltage $V_{in}$ greater than the maximum value at which the circuit still operates correctly in the case in which the drain electrode of the transistor M1 is connected in short-circuit with the gate of the transistor M2, thus optimizing the dynamics of the repeater circuit.

When this optimization of the dynamics of the circuit is not necessary (for example when the supply voltage is sufficiently high), the circuit block LS1 may be simple constructed by a short-circuit, and the repeater circuit is therefore even simpler to implement.

As in the source follower circuit and in the known circuit of FIG. 1, there is also a difference in the circuit of FIG. 3 between the direct voltage supplied as input and the resultant direct voltage supplied as output. This difference, defined as the "offset" voltage between input and output, is equal to the threshold voltage of the transistor M1 plus the overdrive voltage $V_{OV1}$ required for the current $I_1$ to pass through this transistor. In some applications the presence of the offset voltage between input and output is a drawback.

Figure 5:
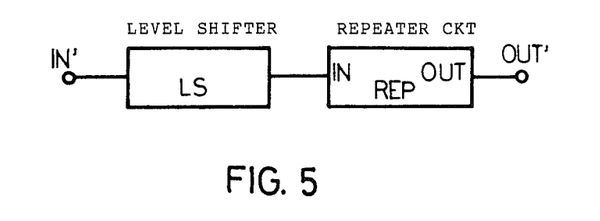
FIG. 5 is a block diagram of a voltage repeater circuit with harmonic distortion compensation, for loads with a resistive component whose value is not very high, in accordance with a further preferred embodiment of the present invention, comprising the circuit of FIG. 3.

FIG. 5 shows the block diagram of a further circuit structure of the invention which may be used in these cases as a voltage repeater circuit which does not have this drawback. This circuit structure, having an input terminal IN' and an output terminal OUT' is developed on a voltage repeater circuit constructed in accordance with the diagram of FIG. 3. This voltage repeater circuit, which has an offset voltage which is not zero between input and output, is shown in FIG. 5 by a block designated by the symbol REP having an input terminal IN and an output terminal OUT.

The output terminal OUT of the circuit block REP also forms the output terminal OUT' of the overall circuit structure. The input terminal IN' of the overall circuit structure is in contrast coupled to the input terminal IN of the circuit block REP by a level shifter circuit, constructed in a known manner, which is shown in FIG. 5 by a block designated by the symbol LS. This circuit generates, between the input terminal IN' of the structure and the input terminal IN of the circuit block REP, a constant potential difference which is equal in absolute terms, but of opposite sign, to the offset voltage between the input and output of the circuit block REP.

From the point of view of the signal, the block LS is obviously equivalent to a short-circuit, as a result of which the circuit structure of FIG. 5 behaves in exactly the same way as the circuit of FIG. 3 for the signal. The offset voltage between the input terminal IN' and the output terminal OUT' is equal to the sum of the potential difference between the terminals IN' and IN and the offset voltage between the terminals IN and OUT and is substantially zero. The circuit structure of FIG. 5 therefore behaves, as desired, as a voltage repeater circuit with low harmonic distortion and a zero offset between input and output, designed to drive a load with a resistive component whose value is not high.

Although a single embodiment of the invention has been described and illustrated, it is evident that many variations are possible without departing from the scope of the invention.

For example, in a further circuit of the invention, the substrate electrode of the transistor M1 is not connected to the source electrode of the transistor, but to the negative terminal $V_{SS}$ of the voltage source. In this case, when the voltage $V_{out}$ supplied as output varies there is a variation in the voltage between the source and substrate electrodes of the transistor M1. As a result of the so-called "body" effect there is a variation in the current-voltage characteristics of the transistor, and therefore the output resistance $r_{out}$ of the voltage repeater circuit depends on the value of the voltage $V_{out}$, although this dependence is an effect of secondary importance as a result of which this circuit embodiment, which is simpler than that of FIG. 3 from a constructional point of view, is also satisfactory for some applications.

A further circuit of the invention may be constructed in a way which is fully complementary with that shown in FIG. 3. The transistors M1 and M3, in this case, are two P-channel transistors and the transistor M2 is an N-channel transistor. The source electrode of the transistor M2 is connected to the negative terminal $V_{SS}$ rather than to the positive terminal $V_{DD}$ of the voltage source, while the source electrode of the transistor M3 is connected to the positive terminal $V_{DD}$ rather than the negative terminal $V_{SS}$. The constant current generator $I_B$ is inserted between the sign of the current which it generates is such as to enable a correct biasing of the transistors of the circuit.

We claim:

1. A voltage repeater circuit with low harmonic distortion for loads with a resistive component, having at least one input terminal for connection to a voltage generator and at least one output terminal for connection to a load, comprising: a first MOSFET transistor having a first type of conductivity, a second MOSFET transistor having a second type of conductivity which is opposite to said first type of conductivity, and a third MOSFET transistor having said first type of conductivity, a gate electrode of said first transistor forming the input terminal of the repeater circuit; a source electrode of said first transistor and drain electrodes of said second and third transistors being connected together at a circuit node which forms the output terminal of the repeater circuit; a drain electrode of said first transistor being connected to a first terminal of a voltage source by means of a constant current generator and being further coupled to a gate electrode of said second transistor by a first circuit means for generating a constant potential difference between these two electrodes, and to a gate electrode of said third transistor by a second circuit means for generating a constant potential difference between these two electrodes; a source electrode of said second transistor being connected to said first terminal of said voltage source and a source electrode of third transistor being connected to a second terminal of said voltage source.

2. A voltage repeater circuit as claimed in claim 1, wherein said first circuit means establishes a constant potential difference equal to zero substantially.

3. A voltage repeater circuit as claimed in claim 1, wherein a substrate electrode of said first transistor is connected to said source electrode thereof.

4. A voltage repeater circuit as claimed in claim 2, wherein a substrate electrode of said first transistor is connected to said source electrode thereof.

5. A voltage repeater circuit as claimed in claim 1, further comprising a compensation capacitor inserted between said drain electrode of said first transistor and one of said first and second terminals of said voltage supply.

6. A voltage repeater circuit as claimed in claim 2, further comprising a compensation capacitor inserted between said drain electrode of said first transistor and one of said first and second terminals of said voltage supply.

7. A voltage repeater circuit as claimed in claim 3, further comprising a compensation capacitor inserted between said drain electrode of said first transistor and one of said first and second terminals of said voltage supply.

8. A voltage repeater circuit as claimed in claim 4, further comprising a compensation capacitor inserted between said drain electrode of said first transistor and one of said first and second terminals of said voltage supply.

9. A voltage repeater circuit as claimed in claim 1, wherein said first and third transistors are N-channel transistors and said second transistor is a P-channel transistor.

10. A voltage repeater circuit as claimed in claim 2, wherein said first and third transistors are N-channel transistors and said second transistor is a P-channel transistor.

11. A voltage repeater circuit as claimed in claim 3, wherein said first and third transistors are N-channel transistors and said second transistor is a P-channel transistor.

12. A voltage repeater circuit a claimed in claim 4, wherein said first and third transistors are N-channel transistors and said second transistor is a P-channel transistor.

13. A voltage repeater circuit as claimed in claim 5, wherein said first and third transistors are N-channel transistors and said second transistor is a P-channel transistor.

14. A voltage repeater circuit as claimed in claim 6, wherein said first and third transistors are N-channel transistors and said second transistor is a P-channel transistor.

15. A voltage repeater circuit as claimed in claim 7, wherein said first and third transistors are N-channel transistors and said second transistor is a P-channel transistor.

16. A voltage repeater circuit as claimed in claim 8, wherein said first and third transistors are N-channel transistors and said second transistor is a P-channel transistor.

17. A voltage repeater circuit as claimed in claim 1, wherein said first and third transistors are P-channel transistors and said second transistor is an N-channel transistor.

18. A voltage repeater circuit as claimed in claim 2, wherein said first and third transistors are P-channel transistors and said second transistor is an N-channel transistor.

19. A voltage repeater circuit as claimed in claim 3, wherein said first and third transistors are P-channel transistors and said second transistor is an N-channel transistor.

20. A voltage repeater circuit as claimed in claim 4, wherein said first and third transistors are P-channel transistors and said second transistor is an N-channel transistor.

21. A voltage repeater circuit as claimed in claim 5, wherein said first and third transistors are P-channel transistors and said second transistor is an N-channel transistor.

22. A voltage repeater circuit as claimed in claim 6, wherein said first and third transistors are P-channel transistors and said second transistor is an N-channel transistor.

23. A voltage repeater circuit as claimed in claim 7, wherein said first and third transistors are P-channel transistors and said second transistor is an N-channel transistor.

24. A voltage repeater circuit as claimed in claim 8, wherein said first and third transistors are P-channel transistors and said second transistor is an N-channel transistor.

* * * * *